(12) United States Patent
Kum et al.

(10) Patent No.: US 10,270,063 B2
(45) Date of Patent: *Apr. 23, 2019

(54) ORGANIC LIGHT EMITTING DISPLAY DEVICE WITH FIRST TO THIRD EMISSION PARTS

(71) Applicant: LG DISPLAY CO., LTD., Seoul (KR)

(72) Inventors: Taeil Kum, Paju-si (KR); Ki-Woog Song, Goyang-si (KR); Seung Kim, Seoul (KR); Jaeseung Jang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/680,402

(22) Filed: Aug. 18, 2017

(65) Prior Publication Data

US 2017/0365819 A1 Dec. 21, 2017

Related U.S. Application Data

(63) Continuation of application No. 15/099,847, filed on Apr. 15, 2016, now Pat. No. 9,774,013.

(30) Foreign Application Priority Data

Jul. 31, 2015 (KR) ........................ 10-2015-0108684

(51) Int. Cl.
*H01L 51/52* (2006.01)
*H01L 27/32* (2006.01)
*H01L 51/50* (2006.01)

(52) U.S. Cl.
CPC ...... *H01L 51/5278* (2013.01); *H01L 27/3244* (2013.01); *H01L 51/504* (2013.01);
(Continued)

(58) Field of Classification Search
CPC ............. H01L 27/3244; H01L 27/3251; H01L 27/3274; H01L 51/5278; H01L 51/504
See application file for complete search history.

(56) References Cited

U.S. PATENT DOCUMENTS 8,040,047 B2 * 10/2011 Ushikubo .............. C09K 11/06
313/503
9,774,013 B2 * 9/2017 Kum .................... H01L 27/3244
(Continued)

FOREIGN PATENT DOCUMENTS

CN 103915569 A 7/2014

OTHER PUBLICATIONS

Y. Dai et al., "Highly efficient and stable tandem organic light-emitting devices based on HAT-CN/HAT-CN: TAPC/TAPC as a charge generation layer", Journal of Materials Chemistry C. Royal Society of Chemistry, XP5532914A, 2015.

*Primary Examiner* — Quoc Hoang
(74) *Attorney, Agent, or Firm* — Dentons US LLP

(57) ABSTRACT

Disclosed is an organic light emitting display device. The organic light emitting display device includes a first emission part between a first electrode and a second electrode, a second emission part on the first emission part, and a first charge generation layer and a second charge generation layer between the first emission part and the second emission part. The first emission part includes a first organic layer, and the second emission part includes a second organic layer. A first thickness includes the first emission part and the first charge generation layer, and a second thickness includes the second emission part and the second charge generation layer. The first thickness is equal to or greater than the second thickness.

27 Claims, 5 Drawing Sheets

(52) U.S. Cl.
CPC ...... *H01L 51/5206* (2013.01); *H01L 51/5221* (2013.01); *H01L 51/5265* (2013.01); *H01L 2251/558* (2013.01)

(56) References Cited

U.S. PATENT DOCUMENTS

| | | |
|---|---|---|
| 2012/0098012 A1 | 4/2012 | Kim et al. |
| 2012/0248971 A1 | 10/2012 | Okuyama |
| 2013/0153881 A1* | 6/2013 | Tokoo ................ H01L 51/5016 257/40 |
| 2014/0183496 A1 | 7/2014 | Heo et al. |
| 2015/0188073 A1 | 7/2015 | Ahn et al. |

\* cited by examiner

ORGANIC LIGHT EMITTING DISPLAY DEVICE WITH FIRST TO THIRD EMISSION PARTS

CROSS-REFERENCE TO RELATED APPLICATIONS

This application is a Continuation of application Ser. No. 15/099,847, filed Apr. 15, 2016, which claims priority to and the benefit of the Korean Patent Application No. 10-2015-0108684 filed on Jul. 31, 2015, all of which are hereby incorporated by reference for all purposes as if fully set forth herein.

BACKGROUND

Field of the Invention

The present invention relates to an organic light emitting display device, and more particularly, to an organic light emitting display device for enhancing a color change rate based on a viewing angle or efficiency.

Discussion of the Related Art

As society advances to be a more information-oriented society, the field of display devices which visually express an electrical information signal is rapidly advancing. Various display devices, having excellent performance in terms of thinness, lightness, and low power consumption, are being developed correspondingly.

Examples of the display devices include liquid crystal display (LCD) devices, plasma display panel (PDP) devices, field emission display (FED) devices, organic light emitting display devices, etc.

Particularly, the organic light emitting display devices are self-emitting devices. In comparison with other display devices, the organic light emitting display devices have a fast response time, high emission efficiency, high luminance, and a wide viewing angle and thus are attracting much attention.

SUMMARY

Accordingly, the present invention is directed to provide an organic light emitting display device that substantially obviates one or more problems due to limitations and disadvantages of the related art.

Recently, organic light emitting display devices for emitting white light have been developed. The organic light emitting display devices are widely applied to various fields such as backlights, illumination, etc. and are being recognized as the most important display devices.

Examples of a method where an organic light emitting display device realizes white may include a single layer emission method, a multilayer emission method, a color conversion method, an element stacked method, etc. The multilayer emission method among the methods is being used at present. In the multilayer emission method, lights are respectively emitted from a plurality of layers, and white is realized by a combination of colors.

An organic light emitting display device using the multilayer emission method includes two or more emitting parts which have different peak wavelengths and are connected to each other. Due to two or more peak wavelengths, white light is emitted by a combination of emission areas having different peak wavelengths in a spectrum. However, due to two or more peak wavelengths, a difference in reduction rate of a peak wavelength occurs depending on a viewing angle corresponding to a direction in which a user looks at an organic light emitting display device. As the difference in reduction rate of a peak wavelength occurs, a color of when an organic light emitting display device is seen from a side differs from a color of when seen from a front. For example, in a case where an organic light emitting display device has a blue peak wavelength and a yellow peak wavelength, white is shown in front of the organic light emitting display device, but if a blue spectrum change rate further increases than a yellow spectrum change rate due to a viewing angle corresponding to a direction in which a user looks at the organic light emitting display device, yellow is more richly shown than blue depending on a viewing angle with respect to the organic light emitting display device. On the other hand, if a blue spectrum change rate is further reduced than a yellow spectrum change rate due to a viewing angle, blue is more richly shown than yellow depending on a viewing angle with respect to the organic light emitting display device. Therefore, in organic light emitting display devices, since colors are changed, it is difficult to realize a uniform screen.

Therefore, the inventors recognize the above-described problems and have done various experiments for improving luminance or efficiency of an organic light emitting display device by adjusting a thickness of each of two or more emission parts configuring the organic light emitting display device. However, in a case of adjusting a thickness of each of the two or more emission parts, it has been recognized that luminance or efficiency is improved, but a color difference occurs because colors are changed depending on a position in the organic light emitting display device.

Through the various experiments, the inventors have invented a new organic light emitting display device in which a thickness of each of emission parts is adjusted to an optimal thickness for enhancing luminance or efficiency, and a color defect caused by a position in the organic light emitting display device is solved.

An aspect of the present invention is directed to provide an organic light emitting display device for enhancing a color reproduction rate, a color change rate based on a viewing angle, or efficiency.

The objects of the present invention are not limited to the aforesaid, but other objects not described herein will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device that includes a first emission part between a first electrode and a second electrode, the first emission part including a first organic layer, a second emission part on the first emission part, the second emission part including a second organic layer, and a first charge generation layer and a second charge generation layer between the first emission part and the second emission part, wherein a first thickness includes the first emission part and the first charge generation layer, a second thickness includes the second emission part and the second charge generation layer, and the first thickness is equal to or greater than the second thickness.

The organic light emitting display device may further include a third emission part on the second emission part, the third emission part including a third organic layer, and a third charge generation layer and a fourth charge generation layer between the second emission part and the third emission part.

The second thickness may further include the third charge generation layer, and a third thickness may include the third emission part and the fourth charge generation layer.

The first thickness may be greater than the third thickness and may be greater than the second thickness.

The third thickness may be greater than the second thickness.

The first thickness may be equal to the third thickness.

The first thickness, the second thickness, and the third thickness may be equal.

The first thickness and the third thickness may be greater than the second thickness.

The first thickness may be equal to the second thickness.

The first thickness and the second thickness may be less than the third thickness.

The first emission part may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer, and the second emission part may include one among a yellow-green emission layer, a green emission layer, a combination of a yellow-green emission layer and a red emission layer, a combination of a yellow emission layer and a red emission layer, and a combination of a green emission layer and a red emission layer.

The third emission part may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

The first electrode may include a transparent electrode, and the second electrode may include a reflective electrode.

In another aspect of the present invention, there is provided an organic light emitting display device that includes a first emission part between a first electrode and a second electrode, the first emission part including a first organic layer, a second emission part on the first emission part, the second emission part including a second organic layer, and a first charge generation layer and a second charge generation layer between the first emission part and the second emission part, wherein a first thickness includes the first emission part and the first charge generation layer, a second thickness includes the second emission part and the second charge generation layer, and the organic light emitting display device has an adjusted thickness of emission parts (ATEP) structure where the first thickness and the second thickness are adjusted to enhance a color change rate based on a viewing angle or efficiency.

The first thickness may be equal to or greater than the second thickness.

When the viewing angle is 60 degrees, the color change rate based on the viewing angle of the organic light emitting display device having the ATEP structure may be 0.050 or less.

The organic light emitting display device may further include a third emission part on the second emission part, the third emission part including a third organic layer, and a third charge generation layer and a fourth charge generation layer between the second emission part and the third emission part.

The second thickness may further include the third charge generation layer, a third thickness may include the third emission part and the fourth charge generation layer, and the organic light emitting display device may have the ATEP structure where the first thickness, the second thickness, and the third thickness are adjusted.

When the viewing angle is 60 degrees, the color change rate based on the viewing angle of the organic light emitting display device having the ATEP structure may be 0.050 or less.

The first thickness may be greater than the third thickness.

The third thickness may be greater than the second thickness.

The first thickness and the third thickness may be greater than the second thickness.

The first thickness may be equal to the third thickness.

The first thickness, the second thickness, and the third thickness may be equal.

The first thickness and the third thickness may be greater than the second thickness.

The first thickness may be equal to the second thickness.

The first thickness and the second thickness may be less than the third thickness.

The first emission part may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer, and the second emission part may include one among a yellow-green emission layer, a green emission layer, a combination of a yellow-green emission layer and a red emission layer, a combination of a yellow emission layer and a red emission layer, and a combination of a green emission layer and a red emission layer.

The third emission part may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

Details of embodiments are included in a detailed description and the drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
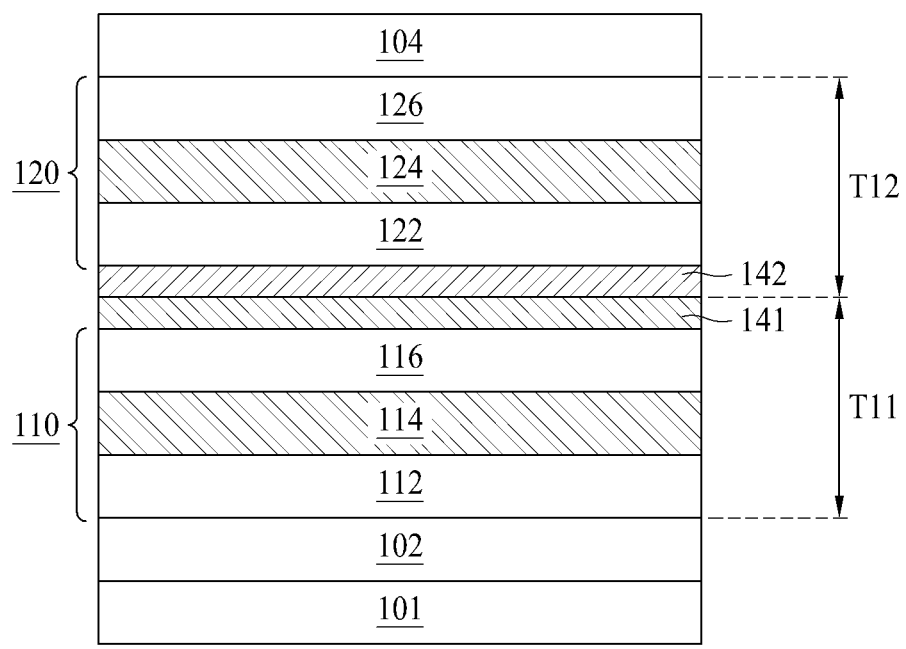
FIG. 1 is a diagram illustrating an organic light emitting device according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

FIG. 1 is a diagram illustrating an organic light emitting device 100 according to an embodiment of the present invention.

The organic light emitting device 100 illustrated in FIG. 1 may include a substrate 101, first and second electrodes 102 and 104, and first and second emission parts 110 and 120 between the first and second electrodes 102 and 104.

The substrate 101 may be formed of an insulating material or a material having flexibility. For example, the substrate 101 may be formed of glass, metal, or plastic, but is not limited thereto. When an organic light emitting display device is a flexible organic light emitting display device, the substrate 101 may be formed of a flexible material such as plastic.

The first electrode 102 may be an anode that supplies a hole, and may be formed of indium tin oxide (ITO) or indium zinc oxide (IZO) which is a transparent conductive material such as transparent conductive oxide (TCO). However, the present embodiment is not limited thereto.

The second electrode 104 may be a cathode that supplies an electron, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 102 and the second electrode 104 may be referred to as an anode or a cathode. Alternatively, the first electrode 102 may be formed as a transmissive electrode, and the second electrode 104 may be formed as a reflective electrode. Alternatively, the first electrode 102 may include a transparent electrode, and the second electrode 104 may include a reflective electrode.

The first emission part 110 may include a first hole transport layer (HTL) 112, a first emission layer (EML) 114, and a first electron transport layer (ETL) 116 which are disposed on the first electrode 102.

A hole injection layer (HIL) may be further formed on the first electrode 102. The HIL enables a hole, supplied from the first electrode 102, to be smoothly injected.

The first HTL 112 may supply a hole, supplied from the HIL, to the first EML 114. The first ETL 116 may supply an electron, supplied from the second electrode 104, to the first EML 114. Therefore, a hole supplied through the first HTL 112 and an electron supplied through the first ETL 116 may be recombined in the first EML 114 to emit light.

The first ETL 116 may be formed of two or more layers or two or more materials. An electron injection layer (EIL) may be further formed on the first ETL 116.

A hole blocking layer (HBL) may be further formed on the first EML 114. The HBL prevents a hole, injected into the first EML 114, from being transferred to the first ETL 116 and thus enhances a combination of an electron and a hole in the first EML 114, thereby enhancing an emission efficiency of the first EML 114. The first ETL 116 and the HBL may be provided as one layer.

An electron blocking layer (EBL) may be further formed under the first EML 114. The EBL prevents an electron, injected into the first EML 114, from being transferred to the first HTL 112 and thus enhances a combination of an electron and a hole in the first EML 114, thereby enhancing an emission efficiency of the first EML 114. The first HTL 112 and the EBL may be provided as one layer.

The first EML 114 may be an emission layer emitting light having a first color. That is, the first EML 114 may include one among a blue emission layer, a deep blue emission layer, and a sky blue emission layer. An emission area of the first EML 114 may be within a range of 440 nm to 480 nm.

The first EML 114 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the first EML 114 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto.

When the first EML 114 includes the yellow-green emission layer which is the auxiliary emission layer, an emission area of the first EML 114 may be within a range of 440 nm to 590 nm. Also, when the first EML 114 includes the red emission layer which is the auxiliary emission layer, the emission area of the first EML 114 may be within a range of 440 nm to 650 nm. Also, when the first EML 114 includes the yellow-green emission layer and the red emission layer which configure the auxiliary emission layer, the emission area of the first EML 114 may be within a range of 440 nm to 650 nm. Therefore, the first EML 114 may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

The first EML 114 may include at least one host and dopant. Alternatively, the first EML 114 may include a mixed host, where two or more hosts are mixed, and at least one dopant. The mixed host may include a host having a hole-transporting characteristic and a host having an electron-transporting characteristic.

The first HTL 112, the first EML 114, the first ETL 116, the HIL, the EIL, the HBL, and the EBL may collectively be referred to as a first organic layer. Therefore, the first emission part 110 may include the first organic layer.

The second emission part 120 may include a second HTL 122, a second EML 124, and a second ETL 126 which are disposed on the first emission part 110.

An electron injection layer (EIL) may be further formed on the second ETL 126. Also, a hole injection layer (HIL) may be further formed under the second HTL 122.

An HBL may be further formed on the second EML 124. The HBL prevents a hole, injected into the second EML 124, from being transferred to the second ETL 126 and thus enhances a combination of an electron and a hole in the second EML 124, thereby enhancing an emission efficiency of the second EML 124. The second ETL 126 and the HBL may be provided as one layer.

An EBL may be further formed under the second EML 124. The EBL prevents an electron, injected into the second EML 124, from being transferred to the second HTL 122 and thus enhances a combination of an electron and a hole in the second EML 124, thereby enhancing an emission efficiency of the second EML 124. The second HTL 122 and the EBL may be provided as one layer.

The second EML 124 may be an emission layer emitting light having a second color. That is, the second EML 124 may include one among a yellow-green emission layer, a green emission layer, a combination of a yellow-green emission layer and a red emission layer, a combination of a yellow emission layer and a red emission layer, and a combination of a green emission layer and a red emission layer. When the second EML 124 includes the yellow-green emission layer, an emission area of the second EML 124 may be within a range of 510 nm to 590 nm. Also, when the second EML 124 includes the green emission layer, the emission area of the second EML 124 may be within a range of 510 nm to 580 nm. Also, when the second EML 124 includes the yellow-green emission layer and the red emission layer, the emission area of the second EML 124 may be within a range of 510 nm to 650 nm. Also, when the second EML 124 includes the yellow emission layer and the red emission layer, the emission area of the second EML 124 may be within a range of 540 nm to 650 nm. Also, when the second EML 124 includes the green emission layer and the red emission layer, the emission area of the second EML 124 may be within a range of 510 nm to 650 nm.

The second EML 124 may include at least one host and dopant. Alternatively, the second EML 124 may include a mixed host, where two or more hosts are mixed, and at least one dopant. The mixed host may include a host having hole-transporting characteristic and a host having electron-transporting characteristic.

The second HTL 122, the second EML 124, the second ETL 126, the HIL, the EIL, the HBL, and the EBL may collectively be referred to as a second organic layer. Therefore, the second emission part 120 may include the second organic layer.

A first charge generation layer (CGL) 141 and a second CGL 142 may be further provided between the first emission part 110 and the second emission part 120. The first CGL 141 and the second CGL 142 may adjust a charge balance between the first emission part 110 and the second emission part 120.

The first CGL 141 may include an N-type CGL. The first CGL 141 which is the N-type CGL may inject an electron into the first emission part 110. The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto.

The second CGL 142 may include a P-type CGL. The second CGL 142 which is the P-type CGL may inject a hole into the second emission part 120. The P-type CGL may be formed as an organic layer including a P-type dopant, but is not limited thereto. Also, the first CGL 141 and the second CGL 142 may be referred to as an organic layer.

In the organic light emitting display device including the organic light emitting device according to an embodiment of the present invention, a pixel area may be defined on the substrate 101 by a gate line and a data line. A power line which extends in parallel with one among the gate line and the data line may be disposed on the substrate 101, and a switching thin film transistor (TFT) connected to the gate line or the data line and a driving TFT connected to the switching TFT may be disposed in the pixel area. The driving TFT may be connected to the first electrode 102.

In the organic light emitting display device to which the organic light emitting device of FIG. 1 is applied, the luminance and efficiency of the organic light emitting display device may be adjusted by adjusting a thickness of each of the first and second emission parts 110 and 120. Therefore, a thickness of each of the first and second emission parts 110 and 120 may be adjusted to an optimal thickness in order for the organic light emitting display device to realize maximum luminance. When a thickness of each of the first and second emission parts 110 and 120 is not optimized, the first EML 114 of the first emission part 110 and the second EML 124 of the second emission part 120 cannot emit light in a desired emission area, causing a reduction in luminance or efficiency of the organic light emitting display device. Also, when a spectrum change rate based on a viewing angle corresponding to a direction in which a user looks at the first EML 114 of the first emission part 110 and the second EML 124 of the second emission part 120 is not regularly changed, a color which differs from a color of when seen from the front of the organic light emitting display device is shown depending on a viewing angle, and for this reason, it is difficult to realize a uniform screen. Therefore, a spectrum change rate based on a viewing angle with respect to each of the first and second EMLs 114 and 124 may be respectively affected by thicknesses of the organic layers respectively included in the first and second emission parts 110 and 120. Also, a spectrum change rate based on a viewing angle with respect to each of the first and second emission EMLs 114 and 124 may be reduced as a viewing angle is widened.

Therefore, the inventors have done various experiments for enhancing the color reproduction, color change rate based on a viewing angle, or efficiency of an organic light emitting display device. Through the various experiments, the inventors have invented a new organic light emitting display device having an adjusted thickness of emission parts (ATEP) structure where a thickness of each of a plurality of emission parts is adjusted.

This will be described below with reference to FIG. 1.

In FIG. 1, a first thickness T11 and a second thickness T12 are illustrated. The first emission part 110 may include the first HTL 112, the first EML 114, and the first ETL 116. Also, the second emission part 120 may include the second HTL 122, the second EML 124, and the second ETL 126. The first CGL 141 and the second CGL 142 may be provided between the first emission part 110 and the second emission part 120 and may be referred to as an organic layer. The organic layers configuring the first and second emission parts 110 and 120 may be changed depending on the configuration or characteristic of the organic light emitting device, but are not limited thereto. Therefore, according to an embodiment of the present invention, the organic light emitting display device may have the ATEP structure where the first thickness T11 including the first emission part 110 and the first CGL 141 and the second thickness T12 including the second emission part 120 and the second CGL 142 are adjusted irrespective of the number or thicknesses of the organic layers configuring the organic light emitting device. That is, the organic light emitting display device may have the ATEP structure where the first thickness T11 including the first emission part 110 and the first CGL 141 and the second thickness T12 including the second emission part 120 and the second CGL 142 are adjusted so as to enhance the color reproduction rate, color change rate based on a viewing angle, or efficiency of the organic light emitting display device. The first thickness T11 may include the first organic layers 112, 114 and 116 and the first CGL 141 which represent the first emission part 110, and the second thickness T12 may include the second organic layers 122, 124 and 126 and the second CGL 142 which represent the second emission part 120. As described above, the first and second organic layers may each include a plurality of organic layers such as an HIL, an EIL, an HBL, and an EBL. Therefore, the number or thicknesses of the first organic layers and the number or thicknesses of the second organic layers do not limit details of the present invention. The first thickness T11 may be configured to be greater than the second thickness T12. For example, a ratio of the first thickness T11 to the second thickness T12 may be 0.56:0.44. Alternatively, the first thickness T11 may be configured to be equal to the second thickness T12. Alternatively, the first thickness T11 may be configured equal to or greater than the second thickness T12. Accordingly, a spectrum change rate based on a viewing angle with respect to each of the first EML 114 of the first emission part 110 and the second EML 124 of the second emission part 120 may be adjusted, and maximum efficiency is realized in a desired emission area. Also, when each of the first and second EMLs 114 and 124 emits light in a desired emission area, the luminance or efficiency of an organic light emitting display device is enhanced, and an organic light emitting display device for displaying a desired color is provided. This will be described below with reference to Table 1 and FIGS. 2 and 3.

The following Table 1 shows a result which is obtained by measuring efficiency, an sRGB area ratio, an sRGB coverage, and a color change rate based on a viewing angle in embodiments 1 and 2 of the present invention and a comparative example 1. In the following Table 1, efficiency of the embodiment 1 of the present invention is set to 100%, and efficiency of the embodiment 2 of the present invention and the comparative example 1 have been compared with efficiency of the embodiment 1.

TABLE 1

|  |  | Embodiment 1 | Embodiment 2 | Comparative Example 1 |
| --- | --- | --- | --- | --- |
| Efficiency | R | 100% | 100% | 100% |
|  | G | 100% | 102% | 102% |
|  | B | 100% | 104% | 82% |
|  | W | 100% | 101% | 100% |
| sRGB | Area Ratio (%) | 118.9 | 113.9 | 101.3 |
|  | Coverage (%) | 100 | 97.5 | 83.8 |
| Color change rate based on a viewing angle |  | 0.027 | 0.045 | 0.107 |

In Table 1, the embodiment 1 of the present invention corresponds to a case where the first thickness T11 is greater than the second thickness T12. The embodiment 2 of the present invention corresponds to a case where the first thickness T11 is equal to the second thickness T12. Also, the comparative example 1 corresponds to a case where the first thickness T11 is less than the second thickness T12. For example, a ratio of the first thickness T11 to the second thickness T12 may be 0.44:0.56.

To describe efficiency, in the embodiment 1 of the present invention, a spectrum change rate based on a viewing angle with respect to the first EML 114 of the first emission part 110 and a spectrum change rate based on a viewing angle with respect to the second EML 124 of the second emission part 120 may be adjusted, and maximum efficiency is realized in a desired emission area. Accordingly, each of the first and second EMLs 114 and 124 may emit light in a desired emission area, thereby enhancing the red (R) efficiency, green (G) efficiency, and blue (B) efficiency of the organic light emitting display device.

It can be seen that green (G) efficiency and blue (B) efficiency are further enhanced in the embodiment 2 of the present invention than the embodiment 1 of the present invention. In the embodiment 2 of the present invention where the first thickness T11 is configured to be equal to the second thickness T12, the second thickness T12 is secured, and thus, green (G) efficiency is enhanced. Also, since a blue emission layer that is the first EML 114 is not disposed close to the first electrode 102, blue (B) efficiency is enhanced.

Moreover, in comparison with the embodiment 1 and embodiment 2 of the present invention, it can be seen that blue (B) efficiency is reduced in the comparative example 1. That is, since the first EML 114 becomes closer to the first electrode 102, the first EML 114 cannot emit light in a desired emission area, and for this reason, blue (B) efficiency is reduced.

sRGB is CIE 1976 standard and may referred to as a color reproduction rate of each of red (R), green (G), and blue (B). The color reproduction rate may be referred to as a color space, a color area, a color reproduction area, a color reproduction range, or a color gamut. Also, depending on requirements of consumers and development of products, the color reproduction rate may be changed in range and may be used as various terms. sRGB area ratio may be referred to as an area ratio of a triangle corresponding to a degree to which colors are displayed. Therefore, as the sRGB area ratio increases, an area for displaying each of red (R), green (G), and blue (B) increases, thereby enhancing the color reproduction rate. Also, the sRGB coverage may denote a range which enables all colors to be displayed. As the sRGB coverage increases, more colors may be displayed, thereby enhancing the color reproduction rate.

As shown in Table 1, it can be seen that in the embodiments 1 and 2 of the present invention, the sRGB area ratios are almost similar, and the sRGB coverages are almost similar. Also, it can be seen that the sRGB area ratio and the sRGB coverage are further reduced in the comparative example 1 than the embodiments 1 and 2 of the present invention.

This will be described below with reference to FIG. 2.

Figure 2:
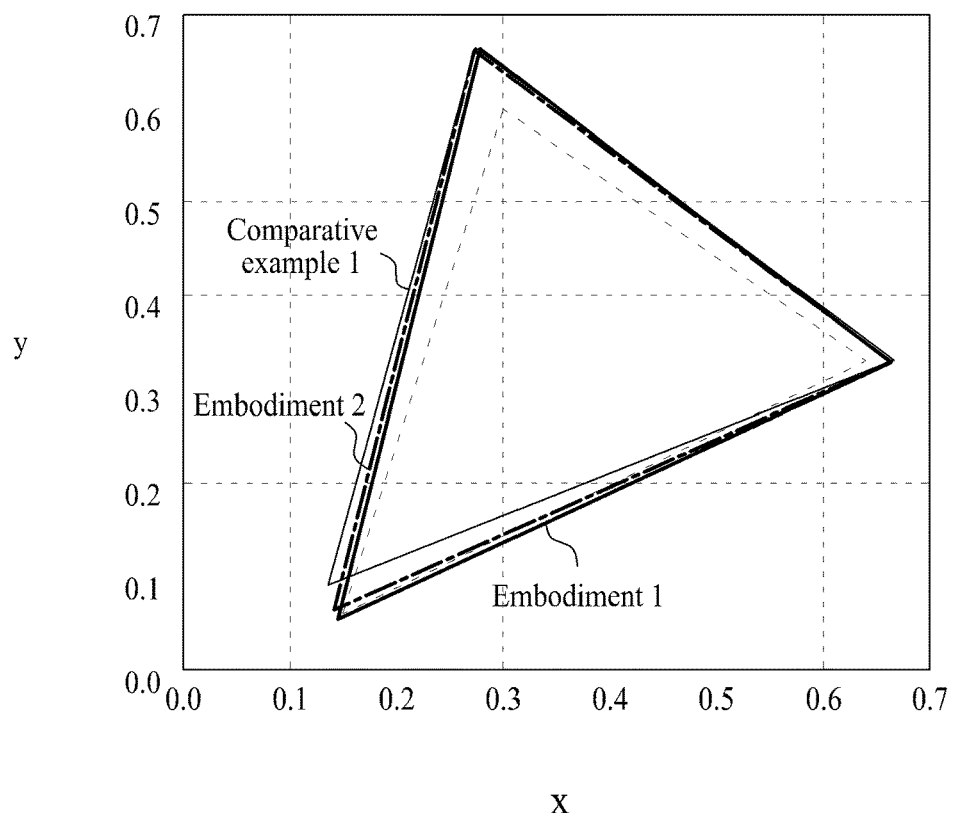
FIG. 2 is a diagram showing a color reproduction rate in an embodiment 1 and an embodiment 2 of the present invention and a comparative example 1.

FIG. 2 is a diagram showing a color reproduction rate in the embodiment 1 and embodiment 2 of the present invention and the comparative example 1.

In FIG. 2, a solid line indicates BT709, and BT709 denotes a color space applied to high-definition televisions (HDTVs). That is, (Cx, Cy) corresponding to red may be (0.640, 0.330), (Cx, Cy) corresponding to green may be (0.300, 0.600), and (Cx, Cy) corresponding to blue may be (0.150, 0060). Also, in FIG. 2, a triangle may be formed by connecting areas respectively corresponding to red, green, and blue. In a method of showing a color reproduction rate, depending on requirements of consumers and development of products, the color reproduction rate may be changed in range and may be used as various terms. In FIG. 2, BT709 does not limit details of the present invention.

As shown in FIG. 2, in comparison with the comparative example 1, it can be seen that in the embodiments 1 and 2 of the present invention, since a wide area is shown, more colors are realized, and thus, the color reproduction rate is enhanced. Also, in comparison with BT709 illustrated as a solid line, a wider area is shown in the embodiments 1 and 2 of the present invention, and thus, a sharper and realistic image may be provided. Also, a range of (0.150, 0060) which is (Cx, Cy) corresponding to blue is broader in the embodiments 1 and 2 of the present invention than the comparative example 1, and thus, colors are more richly displayed.

Moreover, the color change rate based on a viewing angle shown in Table 1 will be described below with reference to FIG. 3.

Figure 3:
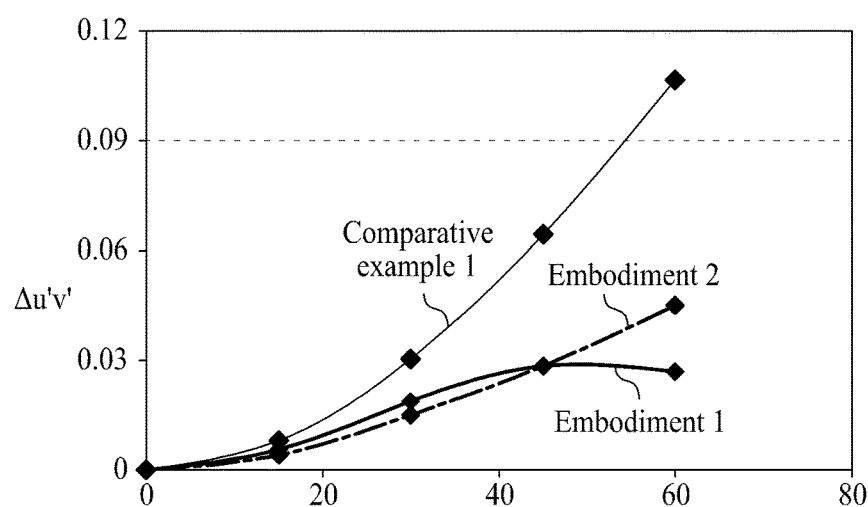
FIG. 3 is a diagram showing a color change rate based on a viewing angle in the embodiment 1 and embodiment 2 of the present invention and the comparative example 1.

FIG. 3 is a diagram showing a color change rate based on a viewing angle in the embodiment 1 and embodiment 2 of the present invention and the comparative example 1.

As shown in FIG. 3, the color change rate based on a viewing angle has been measured at 0 degrees, 15 degrees, 30 degrees, 45 degrees, and 60 degrees with respect to the front of the organic light emitting display device.

A color change rate based on a viewing angle "$\Delta u'v'$" may denote a maximally diagonal angle which enables a user to view a normal screen in front of the organic light emitting display device. Here, the maximally diagonal angle may be 60 degrees or more and less than 90 degrees. In the following description, it is assumed that the maximally diagonal angle is 60 degrees. Therefore, the color change rate based on a viewing angle "$\Delta u'v'$" may denote a difference between a color change rate corresponding to 0 degrees and a color change rate corresponding to 60 degrees with respect to the organic light emitting display device. In white organic light emitting display devices, a plurality of emission layers having two or more colors for emitting white light may be provided, and thus, if spectrum change rates of the emission layers having two or more colors are differently changed depending on a viewing angle, a color difference occurs. As the color change rate based on a viewing angle "$\Delta u'v'$" is reduced, users cannot notice a color difference, thereby providing a screen having no color difference which is caused by a position in an organic light emitting display device and a viewing angle with respect to the organic light emitting display device.

In a viewing angle of 60 degrees with respect to light emitted from the organic light emitting display device, it can be seen that in the color change rate based on a viewing angle "$\Delta u'v'$", the embodiment 1 is 0.027, the embodiment 2 is 0.045, and the comparative example 1 is 0.107. In the viewing angle of 60 degrees, when the color change rate is 0.050 or more, a user can visually notice a color is differently viewed depending on a position in the organic light emitting display device and a viewing angle with respect to the organic light emitting display device. When the color change rate is 0.050 or less under a condition where the viewing angle is 60 degrees, a problem that a color is differently viewed depending on a viewing angle with respect to the organic light emitting display device is solved, and thus, a color difference is removed. That is, in the embodiments 1 and 2 of the present invention, the color change rate is 0.050 or less under the condition where the viewing angle is 60 degrees, thereby providing a display device that prevents the perception of a color difference from occurring due to a position in the organic light emitting display device and a viewing angle with respect to the organic light emitting display device, realizes sharper and realistic image quality, and is suitable for large-screen TVs. Also, in the embodiments 1 and 2 of the present invention, since the color change rate "Δu'v'" based on a viewing angle is small, a color difference that a user perceives depending on a viewing angle with respect to the organic light emitting display device is reduced, thereby enhancing a color reproduction rate.

In the embodiment 1 of the present invention, the first thickness T11 may be configured greater than the second thickness T12. Therefore, when the first EML 114 included in the first emission part 110 is a blue emission layer and the second EML 124 included in the second emission part 120 is a yellow-green emission layer, the blue emission layer may be disposed far away from the first electrode 102 so as to enhance blue (B) efficiency. Therefore, the first thickness T11 may be configured greater than the second thickness T12, and thus, the blue emission layer and the yellow-green emission layer may each emit light in a desired emission area. Also, a spectrum change rate based on a viewing angle with respect to the blue emission layer is almost similar to a spectrum change rate based on a viewing angle with respect to the yellow-green emission layer. That is, the spectrum change rate based on a viewing angle with respect to the blue emission layer and the spectrum change rate based on a viewing angle with respect to the yellow-green emission layer may be adjusted, and thus, red (R) efficiency, green (G) efficiency, and blue (B) efficiency are further enhanced. Also, each of the emission layers may emit light in a desired emission area, thereby improving a color reproduction rate of the organic light emitting display device or a color change rate based on a viewing angle with respect to the organic light emitting display device. Also, in the embodiment 2 of the present invention, the first thickness T11 may be configured to be equal to the second thickness T12, and thus, red (R) efficiency, green (G) efficiency, and blue (B) efficiency are further enhanced, thereby improving a color reproduction rate of the organic light emitting display device or a color change rate based on a viewing angle with respect to the organic light emitting display device.

In the comparative example 1, the first thickness T11 may be configured less than the second thickness T12. In this case, the blue emission layer which is the first EML 114 included in the first emission part 110 may be disposed close to the first electrode 102, and for this reason, the blue emission layer cannot emit light in a desired emission area. Also, a spectrum change rate based on a viewing angle with respect to the blue emission layer increases depending on a viewing angle, and a spectrum change rate based on a viewing angle with respect to the yellow-green emission layer is reduced depending on a viewing angle. Therefore, the spectrum change rate based on a viewing angle with respect to the blue emission layer and the spectrum change rate based on a viewing angle with respect to the yellow-green emission layer may be differently changed, causing a reduction in blue efficiency. That is, the spectrum change rate based on a viewing angle with respect to the blue emission layer further increases than the spectrum change rate based on a viewing angle with respect to the yellow-green emission layer, and for this reason, yellow is more richly shown than blue, causing a reduction in blue efficiency.

Therefore, since the first thickness is configured greater than the second thickness as in the embodiment 1 of the present invention or the first thickness and the second thickness are equally configured as in the embodiment 2 of the present invention, it can be seen that a color reproduction rate, a color change rate based on a viewing angle, or efficiency is enhanced. Also, it can be seen that a color reproduction rate, a color change rate based on a viewing angle, or efficiency is further enhanced in an organic light emitting display device, where the first thickness is equal to or greater than the second thickness, than an organic light emitting display device where the first thickness is less than the second thickness.

In an embodiment of the present invention, the organic light emitting device has been described above as including two emission parts. However, in another embodiment of the present invention, an organic light emitting device may include three emission parts and will be described below with reference to FIG. 4.

Figure 4:
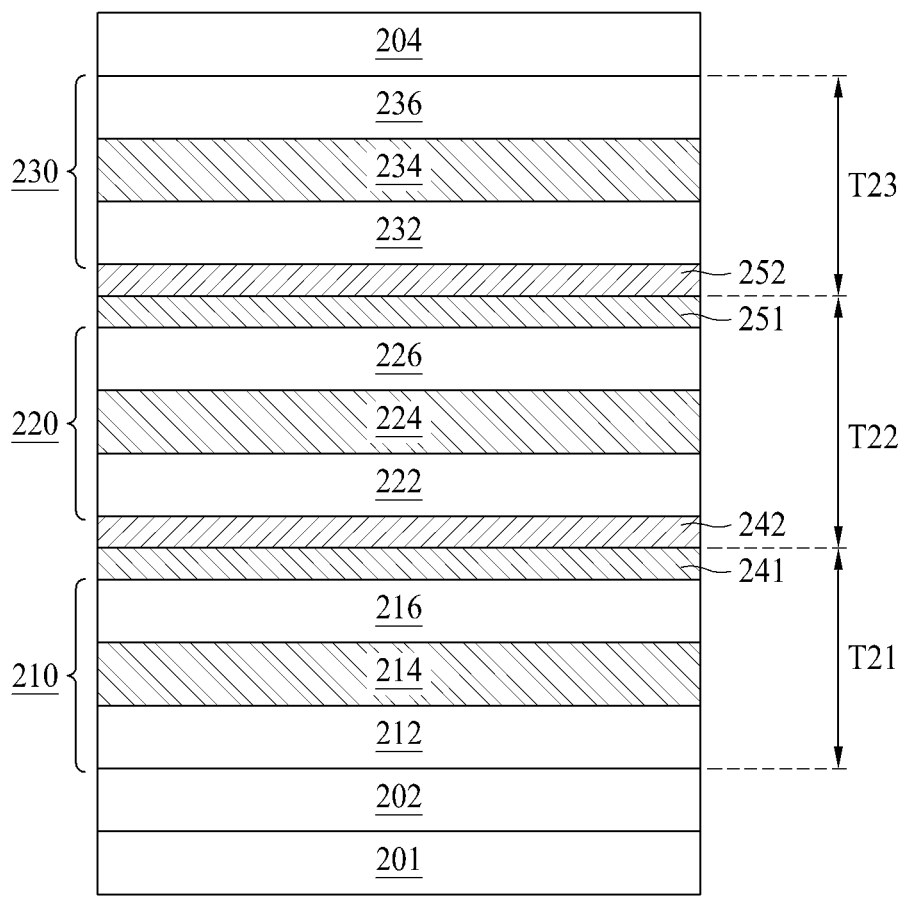
FIG. 4 is a diagram illustrating an organic light emitting device according to another embodiment of the present invention.

FIG. 4 is a diagram illustrating an organic light emitting device 200 according to another embodiment of the present invention.

The organic light emitting device 200 illustrated in FIG. 4 may include a substrate 201, first and second electrodes 202 and 204, and first to third emission parts 210, 220 and 230 between the first and second electrodes 202 and 204.

The substrate 201, first and second electrodes 202 and 204, and first emission part 210 of FIG. 4 may be substantially the same as the substrate 101, the first and second electrodes 102 and 104, and the first emission part 110 described above with reference to FIG. 1. Thus, detailed descriptions of the substrate 201, first and second electrodes 202 and 204, and first emission part 210 of FIG. 4 are omitted.

The first emission part 210 may include a first HTL 212, a first EML 214, and a first ETL 216 which are disposed on the first electrode 202.

An HIL may be further formed on the first electrode 202. Also, an EIL may be further formed on the first ETL 216.

An HBL may be further formed on the first EML 214. The first ETL 216 and the HBL may be provided as one layer.

An EBL may be further formed under the first EML 214. The first HTL 212 and the EBL may be provided as one layer.

The first EML 214 may be an emission layer emitting light having a first color. That is, the first EML 214 may include one among a blue emission layer, a deep blue emission layer, and a sky blue emission layer. An emission area of the first EML 214 may be within a range of 440 nm to 480 nm.

The first EML 214 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the first EML 214 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto.

When the first EML 214 includes the yellow-green emission layer which is the auxiliary emission layer, an emission area of the first EML 214 may be within a range of 440 nm to 590 nm. Also, when the first EML 214 includes the red emission layer which is the auxiliary emission layer, the emission area of the first EML 214 may be within a range of 440 nm to 650 nm. Also, when the first EML 214 includes the yellow-green emission layer and the red emission layer which configure the auxiliary emission layer, the emission area of the first EML 214 may be within a range of 440 nm to 650 nm. Therefore, the first EML 214 may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

The first EML 214 may include at least one host and dopant. Alternatively, the first EML 214 may include a mixed host, where two or more hosts are mixed, and at least one dopant. The mixed host may include a host having hole-transporting characteristic and a host having electron-transporting characteristic.

The first HTL 212, the first EML 214, the first ETL 216, the HIL, the EIL, the HBL, and the EBL may collectively be referred to as a first organic layer.

The second emission part 220 may include a second HTL 222, a second EML 224, and a second ETL 226 which are disposed on the first emission part 210.

An EIL may be further formed on the second ETL 226. Also, an HIL may be further formed under the second HTL 222.

An HBL may be further formed on the second EML 224. The second ETL 226 and the HBL may be provided as one layer.

An EBL may be further formed under the second EML 224. The second HTL 222 and the EBL may be provided as one layer.

The second EML 224 may be an emission layer emitting light having a second color. That is, the second EML 224 may include one among a yellow-green emission layer, a green emission layer, a combination of a yellow-green emission layer and a red emission layer, a combination of a yellow emission layer and a red emission layer, and a combination of a green emission layer and a red emission layer. When the second EML 224 includes the yellow-green emission layer, an emission area of the second EML 224 may be within a range of 510 nm to 590 nm. Also, when the second EML 224 includes the green emission layer, the emission area of the second EML 224 may be within a range of 510 nm to 580 nm. Also, when the second EML 224 includes the yellow-green emission layer and the red emission layer, the emission area of the second EML 224 may be within a range of 510 nm to 650 nm. Also, when the second EML 224 includes the yellow emission layer and the red emission layer, the emission area of the second EML 224 may be within a range of 540 nm to 650 nm. Also, when the second EML 224 includes the green emission layer and the red emission layer, the emission area of the second EML 224 may be within a range of 510 nm to 650 nm.

The second EML 224 may include at least one host and dopant. Alternatively, the second EML 224 may include a mixed host, where two or more hosts are mixed, and at least one dopant. The mixed host may include a host having hole-transporting characteristic and a host having electron-transporting characteristic.

The second HTL 222, the second EML 224, the second ETL 226, the HIL, the EIL, the HBL, and the EBL may collectively be referred to as a second organic layer.

A first CGL 241 and a second CGL 242 may be further provided between the first emission part 210 and the second emission part 220. The first CGL 241 and the second CGL 242 may adjust a balance of electrical charges between the first emission part 210 and the second emission part 220.

The first CGL 241 may include an N-type CGL. The second CGL 242 may include a P-type CGL. The first CGL 241 which is the N-type CGL may inject an electron into the first emission part 210. The second CGL 242 which is the P-type CGL may inject a hole into the second emission part 220.

The third emission part 230 may include a third HTL 232, a third EML 234, and a third ETL 236 which are disposed on the second emission part 220.

An EIL may be further formed on the third ETL 236. Also, an HIL may be further formed under the third HTL 232.

The third EML 234 may be an emission layer emitting light having the same color as the first color. That is, the third EML 234 may include one among a blue emission layer, a deep blue emission layer, and a sky blue emission layer. An emission area of the third EML 234 may be within a range of 440 nm to 480 nm.

The third EML 234 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the third EML 234 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto. When the third EML 234 includes the auxiliary emission layer, an emission area of the third EML 234 may be within a range of 440 nm to 650 nm. Therefore, the third EML 234 may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a red emission layer, a blue emission layer, a deep blue emission layer and a sky blue emission layer.

The third EML 234 may include at least one host and dopant. Alternatively, the third EML 234 may include a mixed host, where two or more hosts are mixed, and at least one dopant. The mixed host may include a host having a hole-transporting characteristic and a host having an electron-transporting characteristic.

An HBL may be further formed on the third EML 234. The HBL prevents a hole, injected into the third EML 234, from being transferred to the third ETL 236 and thus enhances a combination of an electron and a hole in the third EML 234, thereby enhancing an emission efficiency of the third EML 234. The third ETL 236 and the HBL may be provided as one layer.

An EBL may be further formed under the third EML 234. The EBL prevents an electron, injected into the third EML 234, from being transferred to the third HTL 232 and thus enhances a combination of an electron and a hole in the third EML 234, thereby enhancing an emission efficiency of the third EML 234. The third HTL 232 and the EBL may be provided as one layer.

The third HTL 232, the third EML 234, the third ETL 236, the EIL, the HIL, the HBL, and the EBL which configure the third emission part 230 may collectively be referred to as a third organic layer.

A third CGL 251 and a fourth CGL 252 may be further provided between the second emission part 220 and the third emission part 230. The third CGL 251 and the fourth CGL 252 may adjust a balance of electrical charges between the second emission part 220 and the third emission part 230.

The third CGL 251 which is the N-type CGL may inject an electron into the second emission part 220. The fourth CGL 252 which is the P-type CGL may inject a hole into the third emission part 230.

The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The P-type CGL may be formed as an organic layer including a P-type dopant, but is not limited thereto. Also, the third CGL 251 and the fourth CGL 252 may be referred to as an organic layer.

In the organic light emitting display device including the organic light emitting device according to another embodiment of the present invention, a pixel area may be defined on the substrate 201 by a gate line and a data line. A power line which extends in parallel with one among the gate line and the data line may be disposed on the substrate 201, and a switching TFT connected to the gate line or the data line and a driving TFT connected to the switching TFT may be disposed in the pixel area. The driving TFT may be connected to the first electrode 202.

The organic light emitting display device according to another embodiment of the present invention may include three emission parts and may have the ATEP structure where a thickness of each of the emission parts is adjusted. This will be described below with reference to FIG. 4.

In FIG. 4, a first thickness T21, a second thickness T22, and a third thickness T23 are illustrated. The first emission part 210 may include the first HTL 212, the first EML 214, and the first ETL 216. Also, the second emission part 220 may include the second HTL 222, the second EML 224, and the second ETL 226. The first CGL 241 and the second CGL 242 may be provided between the first emission part 210 and the second emission part 220 and collectively may be referred to as an organic layer. Also, the third emission part 230 may include the third HTL 232, the third EML 234, and the third ETL 236. The third CGL 251 and the fourth CGL 252 may be provided between the second emission part 220 and the third emission part 230 and collectively may be referred to as an organic layer. The organic layers configuring the first to third emission parts 210, 220 and 230 may be changed depending on the configuration or characteristic of the organic light emitting device, but are not limited thereto. Therefore, according to another embodiment of the present invention, the organic light emitting display device may have the ATEP structure where the first thickness T21 of the first emission part 210, the second thickness T22 of the second emission part 220, and the third thickness T23 of the third emission part 230 are adjusted irrespective of the number or thicknesses of the organic layers configuring the respective emission parts. That is, the organic light emitting display device may have the ATEP structure where the first to third thicknesses T21 to T23 are adjusted so as to enhance the color reproduction rate, color change rate based on a viewing angle, or efficiency of the organic light emitting display device. The first thickness T21 may include the first organic layer 212, 214 and 216 and the first CGL 241 which configure the first emission part 210. The second thickness T22 may include the second organic layer 222, 224 and 226, the second CGL 242, and the third CGL 251 which configure the second emission part 220. The third thickness T23 may include the third organic layer 232, 234 and 236 and the fourth CGL 252 which configure the third emission part 230. As described above, the first to the second organic layers may each include a plurality of organic layers such as an HIL, an EIL, an HBL, and an EBL. Therefore, the number or thicknesses of the first organic layers, the number or thicknesses of the second organic layers, and the number or thicknesses of the third organic layers do not limit details of the present invention.

The first thickness T21 may be configured greater than the third thickness T23, and the third thickness T23 may be configured greater than the second thickness T22. For example, a ratio of the first thickness T21, the second thickness T22 and the third thickness T23 may be 0.41:0.26:0.33. Alternatively, the first thickness T21 and the third thickness T23 may be equal and configured greater than the second thickness T22. Alternatively, the first to third thicknesses T21 to T23 may be equally configured. Alternatively, the first thickness T21 and the second thickness T22 may be equal and configured less than the third thickness T23. For example, a ratio of the first thickness T21, the second thickness T22 and the third thickness T23 may be 0.30:0.30:0.40.

Through such a configuration, a spectrum change rate based on a viewing angle with respect to each of the first EML 214 and third EML 234 of the first emission part 210 and the third emission part 230 and the second EML 224 of the second emission part 220 may be adjusted, and maximum efficiency is realized in a desired emission area. Also, when each of the first to third EMLs 214, 224 and 234 emits light in a desired emission area, the luminance or efficiency of an organic light emitting display device is enhanced, and an organic light emitting display device for displaying a desired color is provided. This will be described below with reference to Table 2 and FIGS. 5 and 6.

The following Table 2 shows a result which is obtained by measuring efficiency, an sRGB area ratio, an sRGB coverage, and a color change rate based on a viewing angle in embodiments 3 to 5 of the present invention and a comparative example 2. In the following Table 2, efficiency of the embodiment 3 of the present invention is set to 100%, and efficiency of the embodiment 4 of the present invention, efficiency of the embodiment 5 of the present invention and efficiency of the comparative example 2 have been compared with efficiency of the embodiment 3.

TABLE 2

|  |  | Embodiment 3 | Embodiment 4 | Embodiment 5 | Comparative Example 2 |
|---|---|---|---|---|---|
| Efficiency | R | 100% | 106% | 132% | 74% |
|  | G | 100% | 111% | 88% | 105% |

TABLE 2-continued

|  |  | Embodiment 3 | Embodiment 4 | Embodiment 5 | Comparative Example 2 |
|---|---|---|---|---|---|
|  | B | 100% | 89% | 71% | 60% |
|  | W | 100% | 106% | 93% | 93% |
| sRGB | Area Ratio (%) | 118.5 | 111.9 | 111.9 | 111.4 |
|  | Coverage (%) | 100 | 97.5 | 97.2 | 97 |
| Color change rate based on a viewing angle |  | 0.009 | 0.046 | 0.029 | 0.067 |

In Table 2, the embodiment 3 of the present invention corresponds to a case (T21≥T23>T22) where the first thickness T21 is equal to or greater than the third thickness T23 and the third thickness T23 is greater than the second thickness T22. The embodiment 4 of the present invention corresponds to a case where the first thickness T21, the second thickness T22, and the third thickness T23 are equal. The embodiment 5 of the present invention corresponds to a case (T21=T22<T23) where the first thickness T21 is equal to the second thickness T22 and the first thickness T21 and the second thickness T22 are less than the third thickness T23. Also, the comparative example 2 corresponds to a case (T21=T23<T22) where the first thickness T21 is equal to the third thickness T23 and the first thickness T21 and the third thickness T23 are less than the second thickness T22. For example, a ratio of the first thickness T21, the second thickness T22 and the third thickness T23 may be 0.30:0.40:0.30.

To describe efficiency, in the embodiment 3 of the present invention, a spectrum change rate based on a viewing angle with respect to the first EML 214 of the first emission part 210, a spectrum change rate based on a viewing angle with respect to the third EML 234 of the third emission part 230, and a spectrum change rate based on a viewing angle with respect to the second EML 224 of the second emission part 220 may be adjusted, and maximum efficiency is realized in a desired emission area. Accordingly, each of the first to third EMLs 214, 224 and 234 may emit light in a desired emission area, thereby enhancing the red (R) efficiency, green (G) efficiency, and blue (B) efficiency of the organic light emitting display device.

Moreover, it can be seen that red (R) efficiency and green (G) efficiency are further enhanced in the embodiment 4 of the present invention than the embodiment 3 of the present invention. Therefore, it can be seen that efficiency of the second EML 224 included in the second emission part 220 is enhanced in the embodiment 4 of the present invention where the first to third thicknesses T21 to T23 are equally configured. That is, sine the yellow-green emission layer that is the second EML 224 realizes red and green, the second thickness T22 is secured, and thus, red (R) efficiency and green (G) efficiency are enhanced.

Moreover, it can be seen that red (R) efficiency is further enhanced but blue (B) efficiency is further reduced in the embodiment 5 of the present invention than the embodiment 3 of the present invention. Since the third thickness T23 is configured greater than each of the first and second thicknesses T21 and T22, the first EML 214 becomes closer to the first electrode 202, and for this reason, the first EML 214 cannot emit light in a desired emission area, causing a reduction in blue efficiency.

Moreover, in comparison with the embodiments 3 to 5 of the present invention, it can be seen that red (R) efficiency and blue (B) efficiency are reduced in the comparative example 2. That is, since the second thickness T22 is configured greater than each of the first thickness T21 and the third thickness T23, the first EML 214 becomes closer to the first electrode 202, and for this reason, the first EML 214 cannot emit light in a desired emission area, causing a reduction in blue (B) efficiency. Also, a spectrum change rate based on a viewing angle with respect to the yellow-green emission layer is not regularly changed, and for this reason, red (R) efficiency is reduced.

As shown in Table 2, it can be seen that in the embodiments 3 to 5 of the present invention and the comparative example 2, the sRGB area ratios are almost similar, and the sRGB coverages are almost similar.

This will be described below with reference to FIG. 5.

Figure 5:
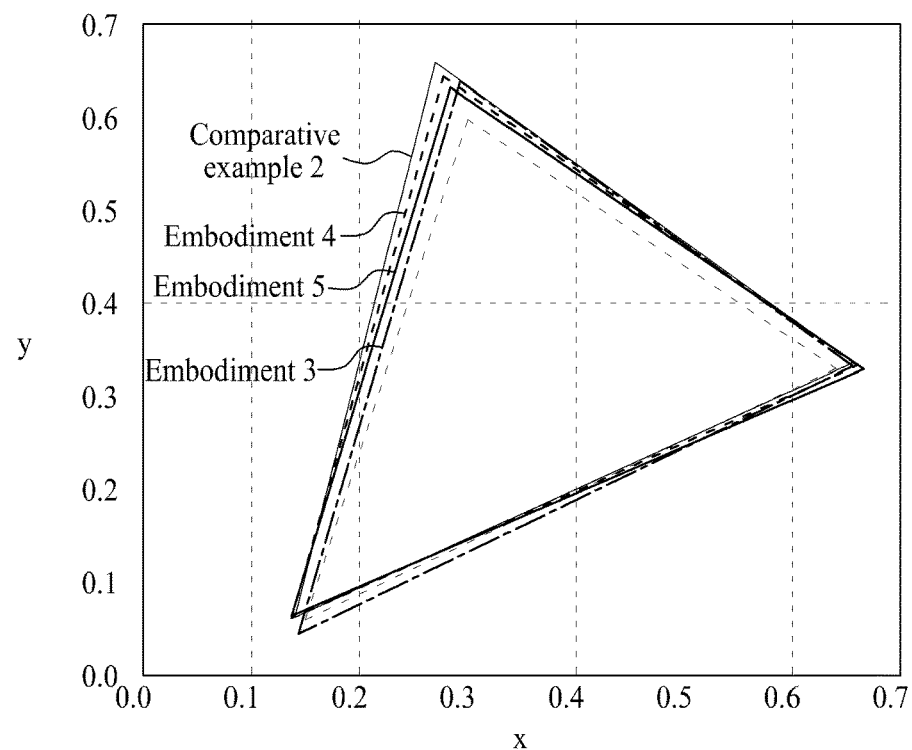
FIG. 5 is a diagram showing a color reproduction rate in an embodiment 3, an embodiment 4, and an embodiment 5 of the present invention and a comparative example 2.

FIG. 5 is a diagram showing a color reproduction rate in the embodiment 3, embodiment 4, and embodiment 5 of the present invention and the comparative example 2.

In FIG. 5, a solid line indicates BT709, and BT709 denotes a color space applied to HDTVs. That is, (Cx, Cy) corresponding to red may be (0.640, 0.330), (Cx, Cy) corresponding to green may be (0.300, 0.600), and (Cx, Cy) corresponding to blue may be (0.150, 0060). Also, in FIG. 5, a triangle may be formed by connecting areas respectively corresponding to red, green, and blue. In a method of showing a color reproduction rate, depending on requirements of consumers and development of products, the color reproduction rate may be changed in range and may be used as various terms. In FIG. 5, BT709 does not limit details of the present invention.

As shown in FIG. 5, in comparison with the comparative example 2, it can be seen that in the embodiments 3 to 5 of the present invention, since a wide area is shown, the color reproduction rate is enhanced. Also, in comparison with BT709 illustrated as a solid line, a wider area is shown in the embodiments 3 to 5 of the present invention, thereby providing an organic light emitting display device that provides a sharper and realistic image and more richly display colors.

Moreover, the color change rate based on a viewing angle shown in Table 2 will be described below with reference to FIG. 6.

Figure 6:
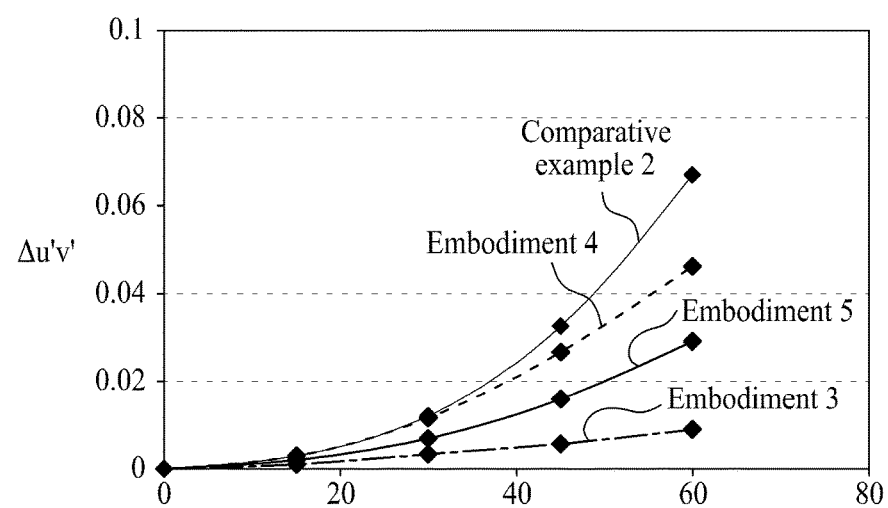
FIG. 6 is a diagram showing a color change rate based on a viewing angle in the embodiment 3, embodiment 4, and embodiment 5 of the present invention and the comparative example 2.

FIG. 6 is a diagram showing a color change rate based on a viewing angle in the embodiment 3, embodiment 4, and embodiment 5 of the present invention and the comparative example 2.

As shown in FIG. 6, the color change rate has been measured at 0 degrees, 15 degrees, 30 degrees, 45 degrees, and 60 degrees with respect to the front of the organic light emitting display device.

In a viewing angle of 60 degrees with respect to light emitted from the organic light emitting device, it can be seen that in the color change rate "Au'v'", the embodiment 3 is 0.009, the embodiment 4 is 0.046, the embodiment 5 is 0.029, and the comparative example 2 is 0.067. In the viewing angle of 60 degrees, when the color change rate is 0.050 or more, a user has a feeling of that a color is differently viewed depending on a position in the organic light emitting display device and a viewing angle with respect to the organic light emitting display device. When the color change rate is 0.050 or less under a condition where the viewing angle is 60 degrees, a problem that a color is differently viewed depending on a viewing angle with respect to the organic light emitting display device is solved, and thus, a color difference is removed. That is, in the embodiments 3 to 5 of the present invention, the color change rate is 0.050 or less under the condition where the viewing angle is 60 degrees, thereby providing a display device that prevents a perception of a color difference from occurring due to a position in the organic light emitting display device and a viewing angle with respect to the organic light emitting display device, realizes sharper and realistic image quality, and is suitable for large-screen TVs. Also, in the embodiments 3 to 5 of the present invention, since the color change rate "Δu'v'" based on a viewing angle is small, a color difference that a user feels depending on a viewing angle with respect to the organic light emitting display device is reduced, thereby enhancing a color reproduction rate.

The embodiment 3 of the present invention may correspond to a case (T21≥T23>T22) where the first thickness T21 is equal to or greater than the third thickness T23 and the third thickness T23 is greater than the second thickness T22. Therefore, when the first EML 214 included in the first emission part 210 is a blue emission layer and the second EML 224 included in the second emission part 220 is a yellow-green emission layer, the blue emission layer may be disposed far away from the first electrode 202 so as to enhance blue efficiency. Therefore, the first thickness T21 may be configured greater than the second thickness T22, and thus, the blue emission layer and the yellow-green emission layer may each emit light in a desired emission area. Also, a spectrum change rate based on a viewing angle with respect to the blue emission layer is almost similar to a spectrum change rate based on a viewing angle with respect to the yellow-green emission layer. That is, the spectrum change rate based on a viewing angle with respect to the blue emission layer and the spectrum change rate based on a viewing angle with respect to the yellow-green emission layer may be adjusted, and thus, red (R) efficiency, green (G) efficiency, and blue (B) efficiency are further enhanced. Also, each of the emission layers may emit light in a desired emission area, thereby improving a color reproduction rate of the organic light emitting display device or a color change rate based on a viewing angle with respect to the organic light emitting display device. Also, in the embodiment 3 of the present invention, red (R) efficiency, green (G) efficiency, and blue (B) efficiency are further enhanced, thereby improving a color reproduction rate of the organic light emitting display device or a color change rate based on a viewing angle with respect to the organic light emitting display device.

Moreover, in the embodiment 4 of the present invention, the first thickness T21, the second thickness T22, and the third thickness T23 may be equally configured, and thus, red (R) efficiency and green (G) efficiency are further enhanced. In this case, since a spectrum change rate based on a viewing angle with respect to the yellow-green emission layer is changed at a constant rate, efficiency of each of red (R) and green (G) realized by the yellow-green emission layer is further enhanced in the embodiment 4 than the embodiment 3, thereby improving a color reproduction rate of the organic light emitting display device or a color change rate based on a viewing angle with respect to the organic light emitting display device.

Moreover, the embodiment 5 of the present invention may correspond to a case (T21=T22<T23) where the first thickness T21 is equal to the second thickness T22 and the first thickness T21 and the second thickness T22 are less than the third thickness T23, and thus, red (R) efficiency is enhanced. In this case, since a spectrum change rate based on a viewing angle with respect to the yellow-green emission layer is very similarly changed, red (R) efficiency is further enhanced in the embodiment 5 than the embodiment 3, thereby improving a color reproduction rate of the organic light emitting display device or a color change rate based on a viewing angle with respect to the organic light emitting display device.

Moreover, the comparative example 2 may correspond to a case (T21=T23<T22) where the first thickness T21 is equal to the third thickness T23 and the first thickness T21 and the third thickness T23 are less than the second thickness T22. In this case, the blue emission layer which is the first EML 214 included in the first emission part 210 may be disposed close to the first electrode 202, and for this reason, the blue emission layer cannot emit light in a desired emission area. Also, a spectrum change rate based on a viewing angle with respect to the blue emission layer increases depending on a viewing angle, and a spectrum change rate based on a viewing angle with respect to the yellow-green emission layer is reduced depending on a viewing angle. Therefore, the spectrum change rate based on a viewing angle with respect to the blue emission layer and the spectrum change rate based on a viewing angle with respect to the yellow-green emission layer may be differently changed, causing a reduction in blue efficiency. That is, the spectrum change rate based on a viewing angle with respect to the blue emission layer further increases than the spectrum change rate based on a viewing angle with respect to the yellow-green emission layer, and for this reason, yellow is more richly shown than blue, causing a reduction in blue efficiency. Therefore, it can be seen that red (R) efficiency and blue (B) efficiency are further reduced in the comparative example 2 than the embodiments 3 to 5. Also, since a color change rate based on a viewing angle more increases in the comparative example 2 than the embodiments 3 to 5, it can be seen that a color reproduction rate of the organic light emitting display device is further reduced in the comparative example 2 than the embodiments 3 to 5.

Therefore, since the organic light emitting display device is configured as in the embodiments 3 to 5 of the present invention, it can be seen that the color reproduction rate, the color change rate based on a viewing angle, or efficiency of the organic light emitting display device is enhanced.

Figure 7:
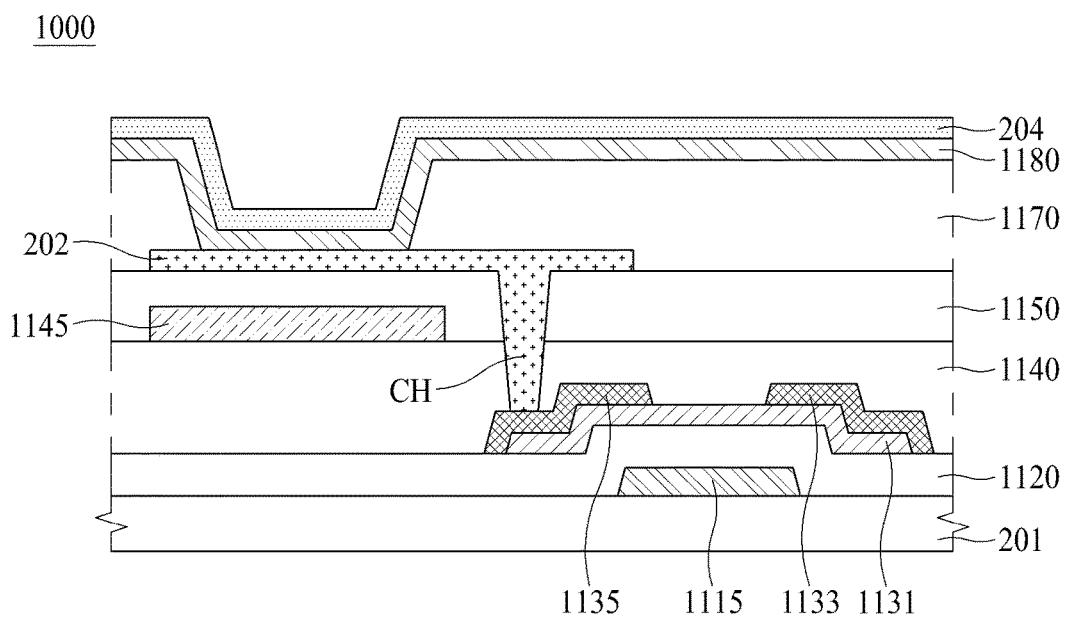
FIG. 7 is a diagram illustrating an organic light emitting display device according to an embodiment of the present invention and another embodiment of the present invention.

FIG. 7 is a cross-sectional view illustrating an organic light emitting display device 1000 including an organic light emitting device according to an embodiment of the present invention and illustrates a case where an organic light emitting device according to an embodiment of the present invention and another embodiment of the present invention is applied.

As illustrated in FIG. 7, the organic light emitting device 1000 according to an embodiment of the present invention may include a substrate 201, a thin film transistor TFT, an overcoat layer 1150, a first electrode 202, an emission part 1180, and a second electrode 204. The thin film transistor TFT may include a gate electrode 1115, a gate insulator 1120, a semiconductor layer 1131, a source electrode 1133, and a drain electrode 1135.

In FIG. 7, the thin film transistor TFT is illustrated as having an inverted staggered structure, but may be formed in a coplanar structure.

The substrate 201 may be formed of an insulating material or a material having flexibility. The substrate 201 may be formed of glass, metal, or plastic, but is not limited thereto. When an organic light emitting display device is a flexible organic light emitting display device, the substrate 201 may be formed of a flexible material such as plastic.

The gate electrode 1115 may be formed on the substrate 201 and may be connected to a gate line (not shown). The gate electrode 1115 may include a multilayer including one material among molybdenum (Mo), aluminum (Al), chromium (Cr), gold (Au), titanium (Ti), nickel (Ni), neodymium (Nd), and copper (Cu) or an alloy thereof.

The gate insulator 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulator 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper (not shown) may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may each be formed of a single layer or a multilayer, and may be formed of one material among molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

A color filter 1145 may be formed on the passivation layer 1140, and although only one sub-pixel is illustrated in the drawing, the color filter 1145 may be formed in each of a red sub-pixel, a blue sub-pixel, and a green sub-pixel. The color filter 1145 may include a red (R) color filter, a green (G) color filter, and a blue (B) color filter which are patterned and formed in respective sub-pixels. The color filter 1145 transmits light having only a specific wavelength among white lights emitted from the emission part 1180.

The overcoat layer 1150 may be formed on the color filter 1145 and may be formed of an acryl resin, a polyimide resin, SiOx, SiNx, or a multilayer thereof, but is not limited thereto.

The first electrode 202 may be formed on the overcoat layer 1150. The first electrode 202 may be electrically connected to the drain electrode 1135 through a contact hole CH which is formed in a certain area of the passivation layer 1140 and the overcoat layer 1150. In FIG. 7, the drain electrode 1135 is illustrated as being electrically connected to the first electrode 202, but the present embodiment is not limited thereto. In another embodiment, the source electrode 1133 may be electrically connected to the first electrode 202 through the contact hole CH which is formed in the certain area of the passivation layer 1140 and the overcoat layer 1150.

A bank layer 1170 may be formed on the first electrode 202 and may define a pixel area. That is, the bank layer 1170 may be formed in a boundary area between a plurality of pixels, and thus, the pixel area may be defined by the bank layer 1170. The bank layer 1170 may be formed of an organic material such as a benzocyclobutene (BCB) resin, an acryl resin, or a polyimide resin. Alternatively, the bank layer 1170 may be formed of a photosensitive material containing a black pigment, and in this case, the bank layer 1170 may act as a light blocking member.

The emission part 1180 may be formed on the bank layer 1170. As illustrated in FIG. 1, the emission part 1180 may include a first emission part and a second emission part which are provided on the first electrode 202. Alternatively, as illustrated in FIG. 4, the emission part 1180 may include a first emission part, a second emission part, and a third emission part which are provided on the first electrode 202.

The second electrode 204 may be formed on the emission part 1180.

Moreover, an encapsulation part may be formed on the second electrode 204. The encapsulation part prevents moisture from penetrating into the emission part 1180. The encapsulation part may include a plurality of layers where different inorganic materials are stacked, or include a plurality of layers where an inorganic material and an organic material are alternately stacked. Also, an encapsulation substrate may be further formed on the encapsulation part. The encapsulation substrate may be formed of glass, plastic, or metal. The encapsulation substrate may be adhered to the encapsulation part by an adhesive.

As described above, according to the embodiments of the present invention, since at least two emission parts have different thicknesses, the color reproduction rate, the color change rate based on a viewing angle, or efficiency of the organic light emitting display device are enhanced.

Moreover, according to the embodiments of the present invention, since the organic light emitting display device has the ATEP structure where thicknesses of at least two emission parts are adjusted, the color reproduction rate, the color change rate based on a viewing angle, or efficiency of the organic light emitting display device are enhanced.

Moreover, according to the embodiments of the present invention, the organic light emitting display device has the ATEP structure where thicknesses of at least two emission parts are adjusted, thereby providing a display device that prevents a color difference from occurring due to a viewing angle, realizes sharper and realistic image quality, and is suitable for large-screen TVs.

The details of the present invention described in technical problem, technical solution, and advantageous effects do not specify essential features of claims, and thus, the scope of claims is not limited by the details described in detailed description of the invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a first emission part between a first electrode and a second electrode, the first emission part including a first organic layer;
   a second emission part on the first emission part, the second emission part including a second organic layer;
   a third emission part on the second emission part, the third emission part including a third organic layer;
   a first charge generation layer and a second charge generation layer between the first emission part and the second emission part; and
   a third charge generation layer and a fourth charge generation layer between the second emission part and the third emission part,
   wherein
   a first thickness comprises the first emission part and the first charge generation layer,
   a second thickness comprises the second emission part and the second charge generation layer, and the first thickness is equal to or greater than the second thickness.

2. The organic light emitting display device of claim 1, wherein
the second thickness further comprises the third charge generation layer, and
a third thickness comprises the third emission part and the fourth charge generation layer.

3. The organic light emitting display device of claim 2, wherein the first thickness is greater than the third thickness and is greater than the second thickness.

4. The organic light emitting display device of claim 3, wherein the third thickness is greater than the second thickness.

5. The organic light emitting display device of claim 2, wherein the first thickness is equal to the third thickness.

6. The organic light emitting display device of claim 5, wherein the first thickness, the second thickness, and the third thickness are equal.

7. The organic light emitting display device of claim 5, wherein the first thickness and the third thickness are greater than the second thickness.

8. The organic light emitting display device of claim 2, wherein the first thickness is equal to the second thickness.

9. The organic light emitting display device of claim 8, wherein the first thickness and the second thickness are less than the third thickness.

10. The organic light emitting display device of claim 1, wherein the first emission part comprises one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer, and
the second emission part comprises one among a yellow-green emission layer, a green emission layer, a combination of a yellow-green emission layer and a red emission layer, a combination of a yellow emission layer and a red emission layer, and a combination of a green emission layer and a red emission layer.

11. The organic light emitting display device of claim 1, wherein the third emission part comprises one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

12. The organic light emitting display device of claim 1, wherein the first electrode comprises a transparent electrode, and the second electrode comprises a reflective electrode.

13. An organic light emitting display device comprising:
a first emission part between a first electrode and a second electrode, the first emission part including a first organic layer;
a second emission part on the first emission part, the second emission part including a second organic layer;
a third emission part on the second emission part, the third emission part including a third organic layer;
a first charge generation layer and a second charge generation layer between the first emission part and the second emission part; and
a third charge generation layer and a fourth charge generation layer between the second emission part and the third emission part,
wherein
a first thickness comprises the first emission part and the first charge generation layer,
a second thickness comprises the second emission part and the second charge generation layer, and
the organic light emitting display device has an adjusted thickness of emission parts (ATEP) structure.

14. The organic light emitting display device of claim 13, wherein the first thickness is equal to or greater than the second thickness.

15. The organic light emitting display device of claim 13, wherein when the viewing angle is 60 degrees, a color change rate based on the viewing angle of the organic light emitting display device having the ATEP structure is 0.050 or less.

16. The organic light emitting display device of claim 13, wherein
the second thickness further comprises the third charge generation layer,
a third thickness comprises the third emission part and the fourth charge generation layer, and
the organic light emitting display device has the ATEP structure where the first thickness, the second thickness, and the third thickness are adjusted.

17. The organic light emitting display device of claim 16, wherein when the viewing angle is 60 degrees, a color change rate based on the viewing angle of the organic light emitting display device having the ATEP structure is 0.050 or less.

18. The organic light emitting display device of claim 16, wherein the first thickness is greater than the third thickness.

19. The organic light emitting display device of claim 18, wherein the third thickness is greater than the second thickness.

20. The organic light emitting display device of claim 16, wherein the first thickness and the third thickness are greater than the second thickness.

21. The organic light emitting display device of claim 16, wherein the first thickness is equal to the third thickness.

22. The organic light emitting display device of claim 21, wherein the first thickness, the second thickness, and the third thickness are equal.

23. The organic light emitting display device of claim 21, wherein the first thickness and the third thickness are greater than the second thickness.

24. The organic light emitting display device of claim 16, wherein the first thickness is equal to the second thickness.

25. The organic light emitting display device of claim 24, wherein the first thickness and the second thickness are less than the third thickness.

26. The organic light emitting display device of claim 13, wherein the first emission part comprises one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer, and
the second emission part comprises one among a yellow-green emission layer, a green emission layer, a combination of a yellow-green emission layer and a red emission layer, a combination of a yellow emission layer and a red emission layer, and a combination of a green emission layer and a red emission layer.

27. The organic light emitting display device of claim 13, wherein the third emission part comprises one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

* * * * *